United States Patent [19]

Schearer et al.

[11] Patent Number: 4,806,864
[45] Date of Patent: Feb. 21, 1989

[54] LASER-PUMPED HELIUM MAGNETOMETER

[75] Inventors: Laird Schearer, Rolla, Mo.; Michèle Leduc, Ablon Sur Seine, France; Franck Laloe, Paris; Joseph M. Hamel, Bretteville Sur Odon, both of France

[73] Assignee: Centre National De La Recherche Scientifique, Paris, France

[21] Appl. No.: 41,571

[22] Filed: Apr. 23, 1987

[30] Foreign Application Priority Data

May 12, 1986 [FR] France .................. 86 06776

[51] Int. Cl.$^4$ .......................... G01R 33/24
[52] U.S. Cl. .................... 324/301; 324/304
[58] Field of Search .......... 324/300, 301, 304, 318, 324/322; 372/41

[56] References Cited

U.S. PATENT DOCUMENTS

| 3,629,697 | 12/1971 | Dupont-Roc et al. | 324/304 |
| 4,193,029 | 3/1980 | Cioccio et al. | 324/301 |
| 4,249,141 | 2/1981 | Brown et al. | 372/41 |
| 4,327,327 | 4/1982 | Greenwood | 324/304 |

FOREIGN PATENT DOCUMENTS 3150391 7/1983 Fed. Rep. of Germany .
1352700 4/1963 France .

OTHER PUBLICATIONS

IEEE Transactions on Magnetics, Francis Hartmann, "Resonance Magnetometers", vol. Mag-8, No. 1, Mar. 1972.

IEEE Journal of Quantum Electronics, Laird D. Schearer et al., "LNA: A new CW Nd Laser Turnable Around 1.05 and 1.08 $\mu$m", vol. OE-22, No. 5, May 1986.

8127 Review of Scientific Instruments, vol. 53 (1982) Sep., Measurement of the Spin Polarization of an Optically Pumped Ensemble of He ($2^3$S) Atoms, Cheng et al.

Primary Examiner—Michael J. Tokar
Attorney, Agent, or Firm—Robbins & Laramie

[57] ABSTRACT

A magnetometer comprises a transparent spherical photocell (1) filled with natural helium 4He. A laser (2) of the LNA (lanthanum-neodymium aluminate) type excites the photocell. An oscillator (3) generates a soft discharge inside the photocell (1). The electronic magnetic resonance frequency of helium atoms in the excited metastable state is determined on the basis of the light (FT) transmitted by the photocell, under excitation by a radio electric field, and the magnetic induction is thereby found.

16 Claims, 5 Drawing Sheets

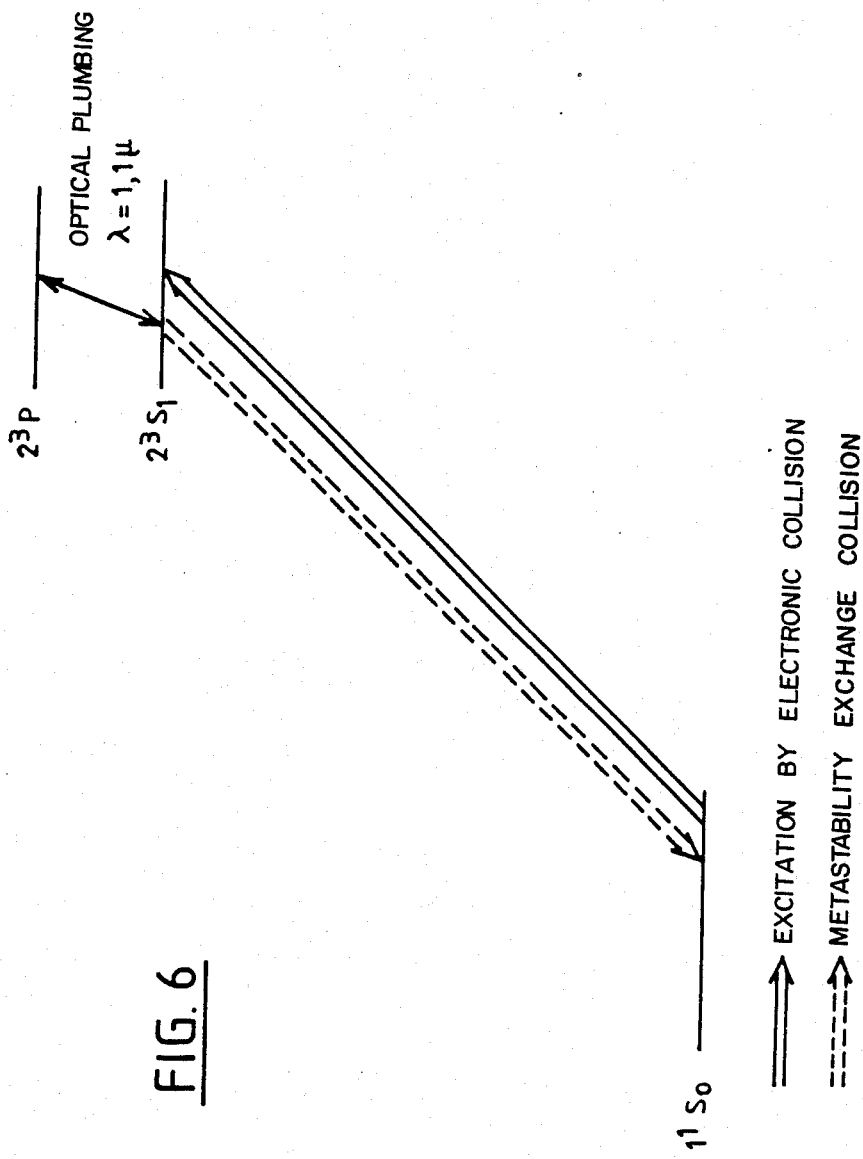

LASER-PUMPED HELIUM MAGNETOMETER

The invention relates to magnetometers, that is, devices allowing measurement of magnetic induction.

Helium magnetometers are already known. They comprise:

a sensing photocell made up of an enclosure at least part of which is transparent and which contains helium, a source of excitation light directed toward the sensing photocell, which in accordance with the prior art consists of a helium photocell.

The magnetic induction prevailing in the photocell may be measured on the basis of the magnetic resonance characteristics of the helium. In order for magnetic resonance to take place, it is necessasry basically to create a population of metastable atoms in the helium; this can be accomplished by means of an electric discharge termed "soft," which will be discussed again in what follows.

Helium magnetometers are very high-performance devices.

One of the claims of the present invention is to improve the performance of such magnetometers even further so as to allow absolute and accurate measurement of very weak magnetic induction or of very small variations in this induction.

Another aim of the invention is to effect considerable improvement, by several orders of magnitude, in the quality of the signal detected for the purpose of measuring magnetic induction.

Another aim of the invention is to enable development of a magnetometer in which optical radiation can be transmitted by means of optical fibers.

Consequently, yet another aim of the invention is to enable development of miniaturized magnetometric probes that are extremely easy to operate.

The invention has the additional aim of providing a magnetometer characterized by a very low average energy consumption.

In its most general definition, the invention consists of the fact that the source of excitation light is embodied in a narrow-band tunable laser rather than the helium lamp that has been employed up to the present. It preferably comprises a semiconductor (diode network) laser.

Another feature of the invention is that the excitation light source comprises a laser of the LNA (lanthanum-neodymium aluminate) type.

It is advantageous for the primary pumping means of the tunable laser to consist of said semiconductor (diode network) laser. The radiation emerging from this laser can be focused on the tunable laser itself.

Another feature of the invention is that the light from the laser is taken to the sensing photoceell through an optical fiber.

Another advantage of LNA lasers is that they can supply directly a linearly polarized light that may be applied directly to the sensing photocell.

The linearly polarized light emerging from the LNA laser is preferably converted to circularly polarized light before being transmitted to the sensing photocell.

From the functional viewpoint, the sensing photocell is combined with means capable of generating a soft high-frequency electric discharge in the photocell so that metastable helium atoms are created. The narrow-band tunable laser is tuned to a line of a spectral transition on the basis of this metastable state.

As will be seen later, the soft electric discharge is a discharge sufficient to generate a beginning of luminous radiation in the sensing photocell, without, however, reaching the intense radiative operation of a "helium lamp." It is a question of populating metastable helium levels without too greatly reducing their relaxation time, which must continue to be of the order of a millisecond.

Specifically, the metastable helium atoms involved are those of the $2^3S_1$ level; the spectral transition is a $2^3P - 2^3S_1$ transition, such as the $2^3P_1 - 2^3S_1$ transition for certain applications.

In a first embodiment of the invention, the magnetometer comprises means for measuring magnetic induction on the basis of the electronic magnetic resonance frequency of helium on the metastable level selected.

This first embodiment is applied chiefly to natural helium (4He), but it could be applied equally to isotopic helium (3He).

Specifically, the measuring means in this instance comprise:

means for application to the sensing photocell of an electromagnetic field of variable radio frequency transverse to the direction of the excitation light, and means for determining the radio frequency value for which the electronic magnetic resonance of the metastable atoms, $2^3S_1$, occurs, on the basis of detection of the luminous flux transmitted through the sensing photocell.

It is advantageous for the transmitted luminous flux to be carried by a second optical fiber.

In a second embodiment of the invention, the sensing photocell contains isotopic helium, 3He, in which case measurement of magnetic induction is effected on the basis of the nuclear magnetic resonance frequency of the 3He atoms in their ground state.

In this instance the measuring means comprise in particular:

a first pair of coils supplied temporarily with a radio frequency electric signal so as to cause brief wobbling of the longitudinal nuclear orientation of the 3He atoms, and a second pair of coils mounted in the immediate vicinity of the photocell to capture the electromotive force induced by the free precession of the nuclear spin of the 3He atoms, following the force wobbling of these atoms. The frequency of the signal thus captured is directly proportional to the magnetic induction value prevailing in the photocell. This measurement is performed "in the dark," with discharge and laser pumping turned off. It may take several hours.

Other characteristics and advantages of the invention will be made clear by examination of the following detailed description and the attached drawings, in which:

FIG. 6 is an atomic equilibrium diagram enabling better understanding of the operation of the invention in its second embodiment.

The drawings will serve to make the following detailed description more understandable. Where applicable, they can also contribute to definition of the invention.

Figure 1:
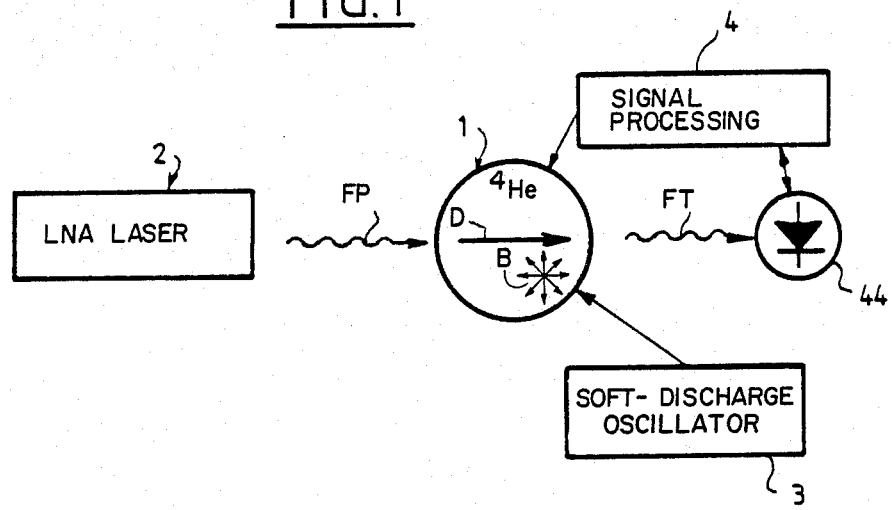
FIG. 1 is a schematic diagram of the first embodiment of the invention.
Figure 3:
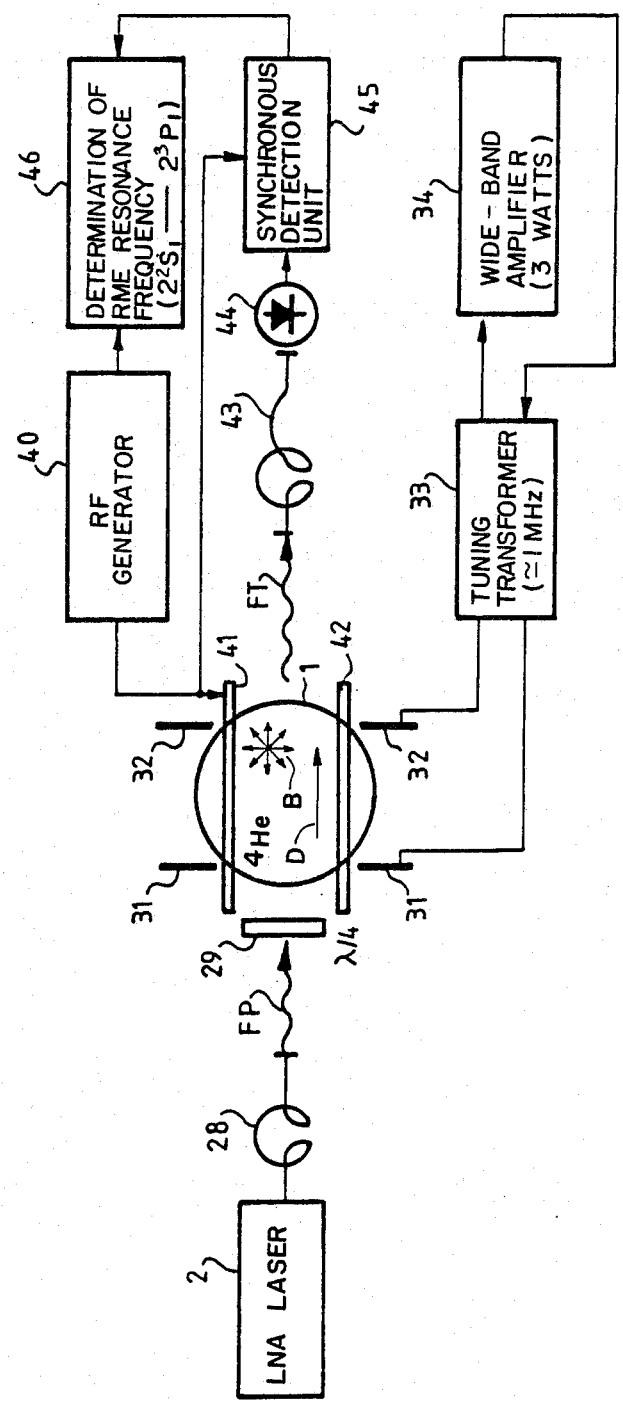
FIG. 3 is a more detailed diagram of the first embodiment of the invention.

In FIGS. 1, 3, 4, and 5, the numeral 1 denotes the magnetometric probe proper. It consists, for example, of a spherical pyrex photocell 3 centimeters in diameter filled with high-purity helium under a pressure of 1 Torr. In the first embodiment, which is shown in FIGS. 1 and 3, the helium is preferably 4He, but 3He may also be used for certain applications.

Figure 4:
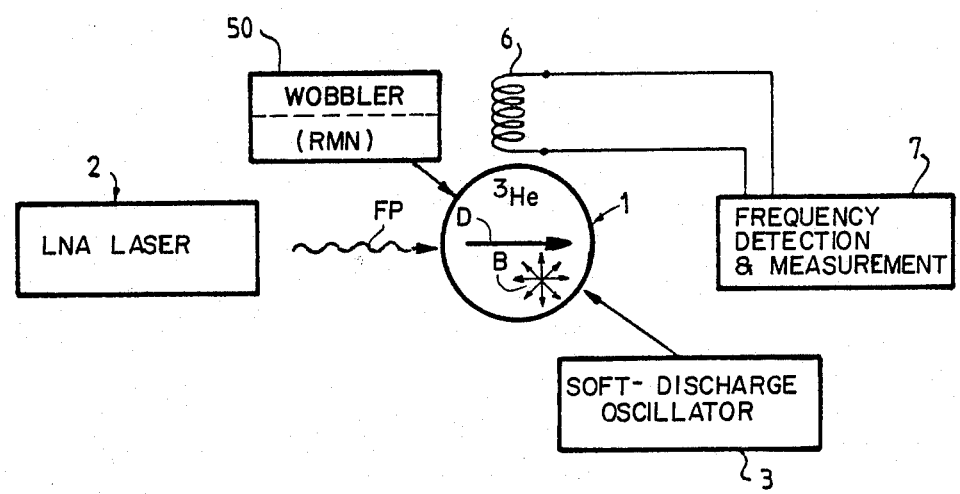
FIG. 4 is a schematic diagram of the second embodiment of the invention.
Figure 5:
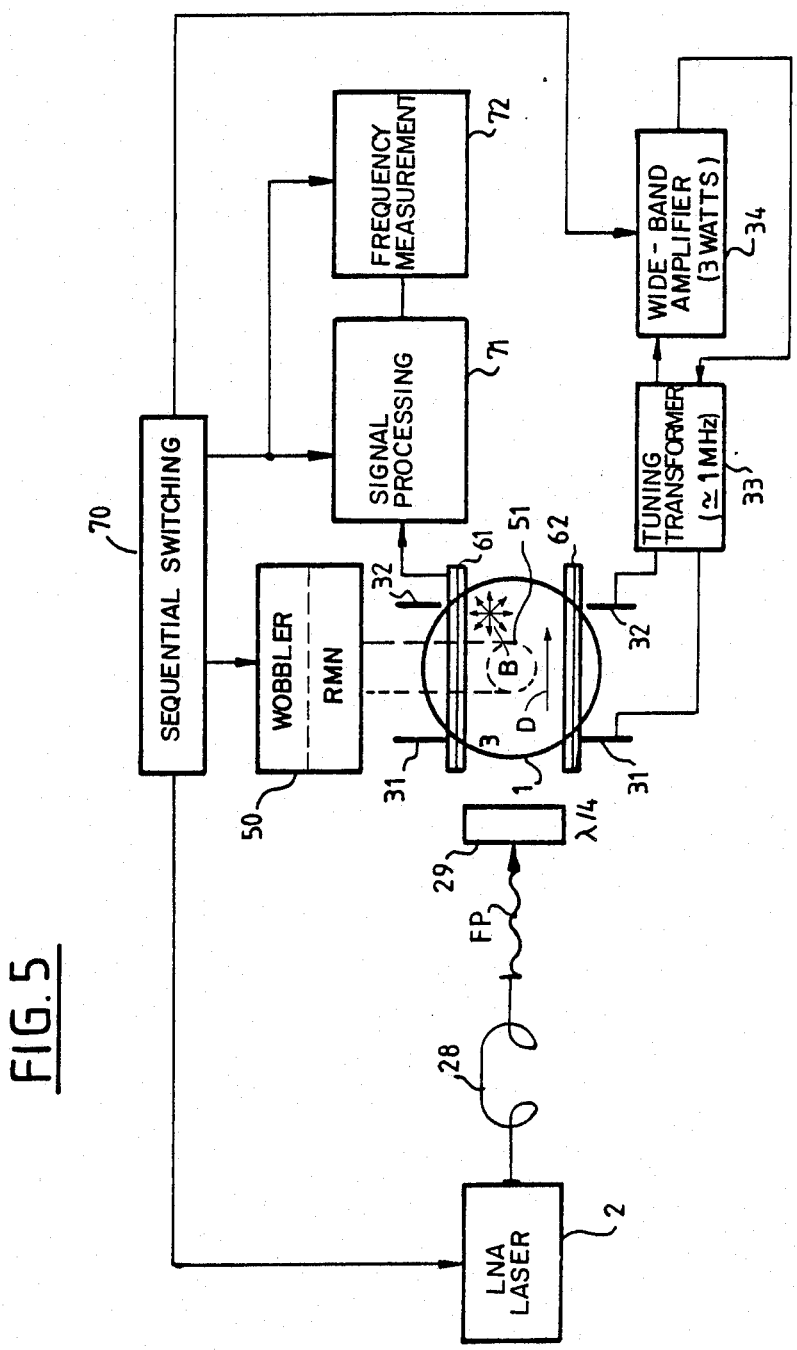
FIG. 5 is a more detailed diagram of the second embodiment of the invention.

On the other hand, isotopic helium 3He must of necessity be used for the second embodiment, which is shown in FIGS. 4 and 5.

An oscillator 3 generates a soft discharge, that is, a very weak discharge, in the photocell, so as to create a population of metastable atoms the energy level of which is $2^3S_1$, or simply $2^3S$ in the Mulliken notation.

As is to be seen from FIGS. 3 and 5, the photocell is mounted between two annular plates 31 and 32 connected to the secondary winding of a transformer 33 tuned to a frequency of the order of 1 megahertz. The primary winding of the transformer is looped on a wideband amplifier with a maximum output of around 3 watts.

Spontaneous turning of the system to a frequency near 1 megahertz then takes place, and such tuning is accompanied by generation of the very weak discharge desired, as well as by creation of metastable $2^3S$ atoms.

Specialists in helium spectroscopy in this instance speak of soft discharges. The high-frequency electric discharge current is just enough to be on the lighting threshold of the "helium lamp" probe, the energy brought to the photocell for this purpose is nevertheless not very high, that is, this "lamp" is only dimly lit. As a result, metastable atoms of the desired $2^3S$ level (among others) are created and these atoms are disturbed only little by the soft discharge (as defined in the foregoing).

A LNA laser, which is a narrow-band tunable laser, supplies a pumping light beam to the photocell 1. The direction of this beam in the photocell is indicated by the arrow D (FIGS. 1 and 4). The device performs measurement of magnetic induction which is independent of the orientation. The accuracy of measurement nevertheless depends on the orientation of the induction relative to D.

The light coming from the laser has a wavelength of 1.08 micron. It leaves the laser with linear polarization. It is transmitted, either directly or through an optical fiber 28, to a circular polarization element 29 (simple quarter-wave plate, in direct transmission, or rather linear polarizer+quarter-wave plate, beyond the optical fiber). The metastable helium atoms created by the discharge are thus oriented longitudinally, in direction D.

Figure 2:
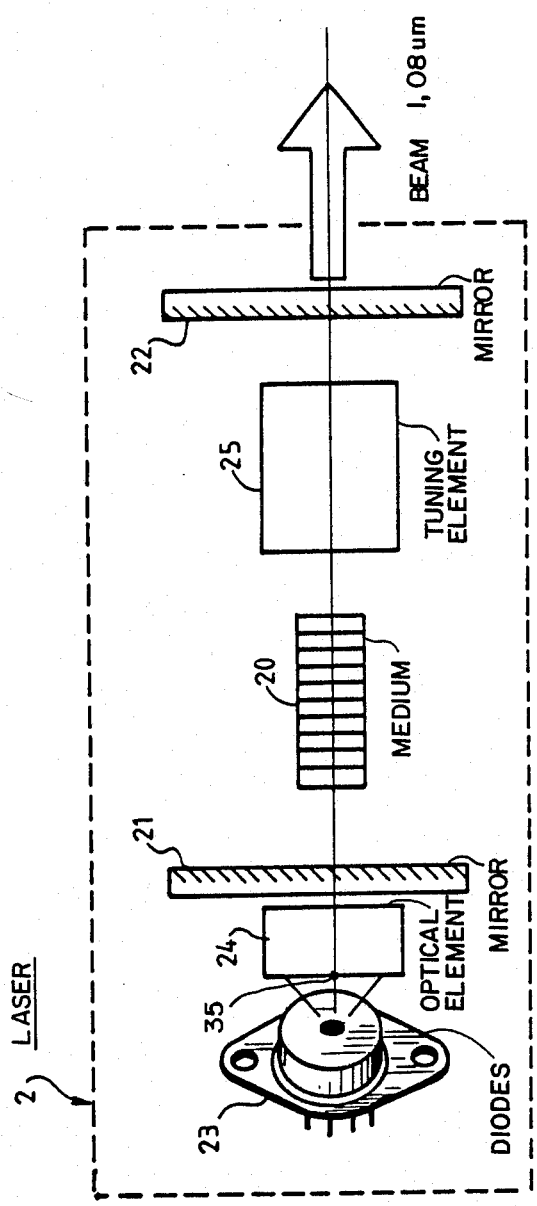
FIG. 2 is a schematic diagram of a LNA laser that may be used to apply the invention.

Reference is now made to FIG. 2, which shows an embodiment of a LNA laser that can be used in accordance with the invention. A LNA laser has been described in particular in the article "LNA: A New CW Nd Laser Tunable Around 1.05 and 1.08 nm," by L. D. Schearer, M. Leduc, B. Vivien, A. M. Lejus, and J. Thery, I.E.E.E. Journal of Quantum Electronics, Volume QE22, May 1986, page 713.

The amplifying medium 20 of the laser 2 is in this instance a monocrystal of lanthanum-neodymium aluminate or LNA. It is located in a cavity with two mirrors 21 and 22. The crystal is pumped longitudinally, for example, through the mirror 21, by radiation which may derive from another laser, in accordance with the invention preferably a network of laser semiconductor diodes capable of emitting a radiation of 200 milliwatts at 800 nanometers. Such a network, shown in 23, is, for example, the SDL 2420 model made by Spectra Diode Labs (United States).

The mirror 21 may be a multidielectric layer deposited directly on the LNA crystal.

An optical element 24 enables collimation of this beam 35 and focussing it so that it strikes the monocrystal 20.

The cavity of the LNA laser also comprises a tuning element 25, which may be of varying nature. Use is made, for example, of a Lyot filter, which allows tuning around 1.08 micron. The bandwidth of the laser output light is in this case around 6 nanometers.

It is highly advantageous to have a thin and uncoated E standard inserted into the cavity to provide much finer tuning, along with significant reduction of the bandwidth.

Hence this laser supplies light at 1.08 micron, for a very narrow band, with limited tuning capability.

Only the first embodiment claimed for the invention will now be considered.

The LNA laser 2 (FIGS. 1 and 3) is tuned to one of the $2^3P - 2^3S$ transitions of the natural 4He helium spectrum.

Such tuning can be accomplished on the fine structure transition D1, which corresponds to $2^3P_1 - 2^3S$ exchanges, or on the transition DO ($2^3P_0 - 2^3S$), or even the transition D2 ($2^3P_2 - 2^3S$). "Fine structure" is the term applied to the energy structure deriving from coupling the orbital kinetic moment and the electron spin.

The important thing is that the laser be tuned in any event only to one of the pertinent transitions of the helium spectrum.

What in effect then takes place is considerable change in the operation of the magnetometer, the observed signals of which are now much more intense.

The following appears to be the reason: whenever a helium lamp is used in accordance with the prior art for magnetometer excitation, this lamp simultaneously emits the three lines D0, D1, and D2 of the transition ($2^3P - 2^3S$). The wavelength difference between them being too small, these lines cannot be isolated, so that only one of these transitions can be applied to the measuring photocell. Hence the three lines are excited in the measuring photocell, but it has been observed that the simultaneous contributions of these three lines are in conflict with each other, thereby considerably diminishing the response of the magnetometer to the phenomenon observed, that is, its response to magnetic induction.

In contrast, the laser excitation claimed for the present invention can be applied to excite a single one of the three transition lines, in this instance preferably line D1 or D0. The response of the magnetometer is thereby considerably improved.

Measurement proper of magnetic induction can be accomplished as follows:

a radio frequency field perpendicular to direction D of induction B is created by two one-turn coils 41 and 42, 4 centimeters in diameter, arranged in the Helmholtz position on both sides of the photocell 1. These coils are supplied by a radio frequency generator 40 whose frequency can be modulated around an adjustable value.

The radio frequency field thereby created perpendicularly to magnetic induction B induces electronic magnetic resonance of the helium on the basis of level $2^3S$.

The resonance may be observed particularly on the basis of the radiation transmitted by the photocell 1. This transmitted radiation, designated FT, is applied directly or through an optical fiber 43 (FIG. 3) to a photodetector 44.

It has been observed that the wavelength of the radiation involved is at the upper limit of the efficiency of silicon photodiodes but in contrast is correctly analyzed by the majority of germanium diodes. Recent measurements have demonstrated, however, that the model S1336-8BQ silicon diodes made by the Hamamatsu Company in Japan are sensitive to radiation at 1.08 micron and have an excellent signal/noise ratio.

The photoelectric current of the diode can be analyzed directly. For the sake of greater accuracy, synchronous detection may also be effected in synchronous detection unit 45, fed by the output of the diode 44 and with the output of the generator 40 as local signal. Measurement then ends with determination of the electronic magnetic resonance frequency by the stage 46. This measurement is performed with zero detection, that is, when the synchronous detection stage 45 indicates that the beam transmitted is in phase quadrature of phase shift at 90° with respect to the output of the adjustably variable local signal from the RF generator 40. It is sufficient then to measure the frequency applied by the generator 40 which is related to the magnetic induction.

It has been observed that the generator 40 may have a power of only a few milliwatts, which is enough to saturate the electronic magnetic resonance. The frequency N of the latter is associated with the magnetic induction B by the relation $$N = 0.28 B,$$

where N is expressed in megahertz and B in millitesla.

The specialist will understand that the device claimed for the invention is designed to perform precision measurements. As a general rule, before this device is applied, less precise ("rough") data are already available on the magnetic induction to be measured. It is not difficult to determine on this basis the frequency of the generator 40 around which it will be necessary to operate in order to measure the magnetic induction, or small variations in it, with precision.

Applications of a magnetometer as accurate as the one claimed for the invention include, for example, measurement of small variations in the components of the Earth's magnetic field for the purpose of detecting, for example, various metallic materials or oilfields.

The first embodiment of the invention has been described thus far with reference to helium 4He. As was pointed out above, it may also be applied to helium 3He for any of the transitions exhibited by the latter starting from the $2^3S$ state.

However, the invention offers a second and different embodiment applicable exclusively to 3He; it presents the advantage of very low electric power consumption.

The measuring photocell 1 is the same as before, except that it is now filled with isotopic helium 3He under a pressure of 1 Torr. The soft discharge device also remains unchanged.

The same is true of optical pumping of the photocell 1 by the laser 2, this pumping being effected at a wavelength of around 1.08 micron.

Reference is now made to FIG. 6, which shows various states of isotropic helium 3He.

The photocell filled with 3He is subjected to high-frequency discharge. The metastable 3He ($2^3S_1$) atoms created by the discharge are oriented in direction D by the optical pumping (electronic orientation).

The difference between helium 4He and helium 3He consists of the fact that the latter possesses nuclear spin.

As a result of "hyperfine coupling," the 3He atoms assume longitudinal nuclear orientation (direction D), in the metastable state $2^3S_1$.

This "hyperfine coupling" occurs between the total electronic kinetic moment and the nuclear spin of 3He in the $2^3S_1$ state.

In addition, metastability exchange collisions occur between the atoms of the excited state $2^3S_1$ and those of the ground state $1^1S_0$. These collisions transfer the nuclear orientation, which consequently passes from the excited metastable atoms to those in the ground state of 3He.

The result of this process is that a 3He isotopic atomic gas is obtained whose nuclei are oriented in the direction of the magnetic induction to be measured. Upon completion of the complex process that has just been briefly described, the helium atoms in the ground state appear to have assumed longitudinal nuclear polarization.

A sequential switching device 70 (FIG. 5) can then interrupt operation of the laser 2 and the soft discharge oscillator 3, for example, by inhibiting the amplifier 34 which the latter comprises.

The atomic gas as thus oriented in the photocell can then remain sensitive to the magnetic field for a considerable amount of time, which may exceed 24 hours.

The magnetic induction measurement itself can be effected by nuclear magnetic resonance of these atoms.

There is for this purpose a pair of small coils 51 and 52 (indicated by broken lines in FIG. 5) positioned on both sides of the photocell 1. It is to be noted in passing that these coils must have their axes perpendicular to direction D in which induction B is measured. Hence the coils 51 and 52 could just as well be parallel to the coils 61 and 62 to be discussed below.

A radio frequency generator 50 is excited briefly so as to supply a radio wobble frequency, along a selected slope, in such a way as to make certain of passing through the magnetic resonance frequency over an adapted period. The generator 50 is then stopped.

Brief wobbling of the longitudinal orientation of the nuclear spin of the 3He takes place on transition to the good frequency. In other words, while this spin initially was in the direction of induction B, it now comes to assume a perpendicular direction.

Specialists know that such wobbling will be followed by the occurrence of free precession of the nuclear spin around the direction of the static field, at a frequency proportional to the amplitude of induction B in the photocell.

Hence two other coils 61 and 62 are provided which it is advantageous to place in the Helmholtz position on both sides of the photocell 1, with a common axis perpendicular to the direction of measurement of induction B.

The signal collected at the terminals of the coils 61 and 62 is applied to a signal processing device 71 which, for example, isolates the noise from the signal. It then suffices to effect frequency measurement in the stage 72, by one of the known nuclear magnetic resonance methods.

In other words, the pair of coils 61 and 62 traps the electromotive force induced by the free precession of the nuclear spin after the induced wobbling of this spin. And it is then enough to measure the frequency of this signal in order to find the magnetic induction value, by means of the following relation:

$$N = 0.3244\ B,$$

where N is the frequency measured, in kilohertz, while B is the magnetic induction, in millitesla.

The frequency of the signal collected at the terminals of the coils is thus directly proportional to the magnetic induction value to be measured.

In addition to the advantages it shares with the first embodiment, this device is also consonant with very low average power consumption.

It is sufficient in effect to cause excitation of the photocell by the soft electric discharge and lighting of the LNA laser 2. The nuclear orientation of the helium 3He is established for a period of several minutes thereafter.

All electric excitation may then be stopped. Brief wobbling of the nuclear spin in the ground state is induced. Free precession of the nuclear magnetic moments then ensues in the magnetic induction to be measured, this being a stage which may last several hours.

The present invention is not, of course, limited to the embodiments described, as for example to use of a LNA laser. Although use of fiber optics and of laser diodes is particularly advantageous, another mode of operation may naturally be followed.

The same is true of the soft discharge means, inasmuch as the invention can be applied with any means enabling creation of metastable atoms with the desired level.

Again, the same is true of the optical detection means described with reference to FIGS. 1 and 3, and also of the radio electric detection means described with reference to FIGS. 4 and 5.

We claim:

1. A helium magnetometer of the type comprising:
   a sensing photocell (1) comprising an enclosure at least partly transparent and containing helium,
   a source of excitation light (2) directed toward the sensing photocell,
   wherein the magnetic induction prevailing in the photocell is measured on the basis of the magnetic resonance characteristics of any energy level of helium, and wherein the source of excitation light (2) is a narrow-band tunable laser tuned to a selected one energy level of the helium.

2. A magnetometer as claimed in claim 1, wherein the source of excitation light comprises and semiconductor laser.

3. A magnetometer as claimed in claim 1, wherein the source of excitation light (2) comprises a laser of the LNA (lanthanum-neodymium aluminate) type.

4. A magnetometer as claimed in claim 3, wherein said LNA laser (2) comprises:
   a monocrystal (20) of LNA positioned between the two relecting elements (21, 23),
   the primary pumping means (23, 24) of this laser, and the tuning means (25) of this laser.

5. A magnetometer as claimed in claim 2, wherein the semiconductor laser (23) is used for primary pumping of the tunable laser (24).

6. A magnetometer as claimed in claim 3, wherein the output light (FP) of the LNA laser is transmitted to the sensing photocell through a circular polarizer (29).

7. A magnetometer as claimed in claim 6, wherein the light of the laser (FP) is taken to the sensing photocell through an optical fiber (28).

8. A magnetometer as claimed in claim 1, wherein said magnetometer comprises means (3) associated with the sensing photocell for generation in said photocell of a high-frequency soft discharge capable of creating metastable helium atoms, and wherein the narrow-band tunable laser (2) is tuned to one line of a spectral transition on the basis of this metastable state.

9. A magnetometer as claimed in claim 8, wherein the metastable helium atoms are those of the $2^3S$ level and wherein the spectral transition is a $2^3P - 2^3S$ transition.

10. A magnetometer as claimed in claim 9, wherein said magnetometer comprises means for measurement of magnetic induction on the basis of the electronic magnetic resonance frequency of the helium at the metastable level.

11. A magnetometer as claimed in claim 10, wherein said measurement means comprise:
    means (40, 41, 42) for application to the photocell of an electromagnetic field of variable radio frequency transverse to the direction of the excitation light, and
    means (44, 45, 46) for determination of the radio frequency value for which the electronic magnetic resonance of the metastable atoms $2^3S_1$ occurs, on the basis of detection (44) of the luminous flux transmitted through the photocell.

12. A magnetometer as claimed in claim 11, wherein the means for measuring the transmitted luminous flux operate through synchronous detection (45) relative to the frequency value of the transverse electromagnetic field.

13. A magnetometer as claimed in claim 11, wherein measurement of the transmitted luminous flux (FT) is effected by means of another optical fiber (43).

14. A magnetometer as claimed in claim 10, wherein the photocell (1) contains natural helium 4He.

15. A magnetometer as claimed in claim 1, wherein the photocell (1) contains isotropic helium 3He, and wherein said magnetometer comprises means (7) for measuring the magnetic induction on the basis of the nuclear magnetic resonance frequency of 3He atoms.

16. A magnetometer as claimed in claim 15, wherein said measurement means comprise:
    a first pair of coils (50) temporarily energized so as to induce brief wobbling of the longitudinal nuclear orientation of 3He atoms, and
    a second pair of coils (61, 62) mounted in the immediate vicinity of the photocell to trap the electromotive force induced by the free precession of the nuclear spin of 3He atoms following the forced wobbling of these atoms, the frequency of the signal thus trapped (71, 72) being directly proportional to the magnetic induction value prevailing in the photocell.

* * * * *